(12) United States Patent
Liu et al.

(10) Patent No.: US 10,433,425 B1
(45) Date of Patent: Oct. 1, 2019

(54) THREE-DIMENSIONAL HIGH QUALITY PASSIVE STRUCTURE WITH CONDUCTIVE PILLAR TECHNOLOGY

(71) Applicant: QUALCOMM Incorporated, San Diego, CA (US)

(72) Inventors: Kai Liu, San Diego, CA (US); Changhan Hobie Yun, San Diego, CA (US); Jonghae Kim, San Diego, CA (US); Mario Francisco Velez, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/051,876

(22) Filed: Aug. 1, 2018

(51) Int. Cl.
| H05K 1/18 | (2006.01) |
| H05K 1/11 | (2006.01) |
| H05K 1/03 | (2006.01) |
| H05K 3/46 | (2006.01) |
| H05K 3/40 | (2006.01) |
| H05K 3/28 | (2006.01) |
| H05K 1/02 | (2006.01) |

(52) U.S. Cl.
CPC .......... *H05K 1/185* (2013.01); *H05K 1/0243* (2013.01); *H05K 1/0306* (2013.01); *H05K 1/115* (2013.01); *H05K 3/284* (2013.01); *H05K 3/4007* (2013.01); *H05K 3/4038* (2013.01); *H05K 3/46* (2013.01); *H05K 2201/0175* (2013.01); *H05K 2201/095* (2013.01); *H05K 2201/1003* (2013.01); *H05K 2201/1006* (2013.01); *H05K 2203/1316* (2013.01)

(58) Field of Classification Search
USPC .......................................................... 361/782
See application file for complete search history.

(56) References Cited

U.S. PATENT DOCUMENTS

| 7,955,942 | B2 | 6/2011 | Pagaila et al. |
| 9,343,442 | B2 | 5/2016 | Chen et al. |
| 9,673,173 | B1 | 6/2017 | Li et al. |
| 9,711,492 | B2 | 7/2017 | Albers et al. |
| 2017/0338034 | A1 | 11/2017 | Yun et al. |
| 2018/0337136 | A1* | 11/2018 | Han ............... H01L 23/5389 |
| 2018/0358298 | A1* | 12/2018 | Zhai .............. H01L 21/6835 |

* cited by examiner

*Primary Examiner* — Andargie M Aychillhum
(74) *Attorney, Agent, or Firm* — Qualcomm Incorporated/Seyfarth Shaw LLP (57) ABSTRACT

A passive structure using conductive pillar technology instead of through via technology includes a substrate having a first redistribution layer (RDL) and a three-dimensional (3D) integrated passive device on the substrate. The passive structure includes multiple pillars on the substrate where each of the pillars is taller than the 3D integrated passive device. The passive structure further includes a molding compound on the substrate surrounding the 3D integrated passive device and the pillars. Furthermore, the passive structure includes multiple external interconnects coupled to the first RDL through the pillars.

16 Claims, 11 Drawing Sheets

FIG. 11

THREE-DIMENSIONAL HIGH QUALITY PASSIVE STRUCTURE WITH CONDUCTIVE PILLAR TECHNOLOGY

BACKGROUND

Field

Aspects of the present disclosure relate to semiconductor devices and, more particularly, to three-dimensional high quality passive structures with conductive pillar technology.

Background

Mobile radio frequency (RF) chips (e.g., mobile RF transceivers) have migrated to a deep sub-micron process node due to cost and power consumption considerations. The design complexity of mobile RF transceivers is further complicated by adding circuit functions for supporting communications enhancements, such as fifth generation (5G) technologies. Further design challenges for mobile RF transceivers include analog/RF performance considerations, including mismatch, noise, and other performance considerations. Designing these mobile RF transceivers includes using passive devices, for example, for suppressing resonance, and/or for performing filtering, bypassing, and coupling.

Successfully fabricating modern semiconductor chip products involves interplay between the materials and the processes employed. In particular, passive components for modern semiconductor chips is an increasingly challenging part of the process flow. This is particularly true in terms of maintaining a small feature size. The same challenge of maintaining a small feature size also applies to passive-on-glass (POG) technology.

SUMMARY

A device may include a substrate having a first redistribution layer (RDL) and a three-dimensional (3D) integrated passive device on the substrate. The device may also include multiple pillars on the substrate. Each of the pillars is taller than the 3D integrated passive device. The device further includes a molding compound on the substrate. The molding compound surrounds the 3D integrated passive device and the pillars. Furthermore, the device includes multiple external interconnects coupled to the first RDL through the pillars.

A method of making an electronic device may include forming a substrate having a first redistribution layer (RDL) and forming a three-dimensional (3D) integrated passive device on the substrate. The method may also include forming multiple pillars on the substrate. Each of the pillars is taller than the 3D integrated passive device. The method further includes depositing a molding compound on the substrate so the molding compound surrounds the 3D integrated passive device and the pillars. Furthermore, the method includes forming multiple external interconnects coupled to the first RDL through the pillars.

A radio frequency (RF) front end module includes a device having a substrate including a first redistribution layer (RDL), a three-dimensional (3D) integrated passive device on the substrate, and multiple pillars on the substrate. Each of the pillars is taller than the 3D integrated passive device. The device also has a molding compound on the substrate where the molding compound surrounds the 3D integrated passive device and the pillars. The device further includes multiple external interconnects coupled to the first RDL through the pillars. The RF front end also has an antenna coupled to the device.

This has outlined, rather broadly, the features and technical advantages of the present disclosure in order that the detailed description that follows may be better understood. Additional features and advantages of the present disclosure will be described below. It should be appreciated by those skilled in the art that this present disclosure may be readily utilized as a basis for modifying or designing other structures for carrying out the same purposes of the present disclosure. It should also be realized by those skilled in the art that such equivalent constructions do not depart from the teachings of the present disclosure as set forth in the appended claims. The novel features, which are believed to be characteristic of the present disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. It will be apparent, however, to those skilled in the art that these concepts may be practiced without these specific details. In some instances, well-known structures and components are shown in block diagram form in order to avoid obscuring such concepts. Other aspects, as well as features and advantages of various aspects, will become apparent to those of skill in the art through consideration of the ensuing description, the accompanying drawings, and the appended claims.

The use of the term "and/or" is intended to represent an "inclusive OR," and the use of the term "or" is intended to represent an "exclusive OR." As described herein, the term "exemplary" used throughout this description means "serving as an example, instance, or illustration," and should not necessarily be construed as preferred or advantageous over other exemplary configurations. The term "coupled" used throughout this description means "connected, whether directly or indirectly through intervening connections (e.g., a switch), electrical, mechanical, or otherwise," and is not necessarily limited to physical connections. Additionally, the connections can be such that the objects are permanently connected or releasably connected. The connections can be through switches.

Mobile radio frequency (RF) chip designs (e.g., mobile RF transceivers) have migrated to a deep sub-micron process node due to cost and power consumption considerations. The design complexity of mobile RF transceivers is further complicated by added circuit functions for supporting communications enhancements, such as fifth generation (5G) wireless systems. Implementing 5G wireless systems increasingly involves additional passive devices. For example, two-dimensional (2D) passive-on-glass (POG) filters leverage stacked copper (Cu) inductors and copper/silicon nitride (SiN)/copper (Cu/SiN/Cu) metal-insulator-metal (MIM) capacitors. Unfortunately, design rules in 5G wireless systems restrict the design of these additional passive devices. For example, at higher frequencies (e.g., three GHz and above), low capacitance values are used, thereby increasing capacitor size due to serial capacitor stacking. The increased series capacitor stacking results in a larger passive-on-glass filter size.

Passive-on-glass devices include high-performance inductor and capacitor components having a variety of advantages over other technologies, such as surface mount technology or multi-layer ceramic chips. These advantages include a more compact size and smaller manufacturing variations. Passive-on-glass devices also support a higher quality (Q)-factor value that meets stringent low insertion loss and low power consumption specifications of future process nodes. Passive devices such as inductors may be implemented as three-dimensional (3D) structures when using passive-on-glass technologies. 3D through substrate inductors or other 3D devices, however, may experience a number of design constraints when implemented as 3D structures using passive-on-glass technology. For example, a through glass via (TGV) is used to implement high-performance solenoid type inductors for 5G radio frequency applications. However, via formation/via filling processes can cause quality issues, incur high costs, use complex process flow, and use complex supply chains. Additionally, through glass via technology has limitations on high aspect ratio/fine pitch through glass vias.

Aspects of the present disclosure are directed to fabricating a passive structure (e.g., a solenoid structure) using conductive (e.g., copper (Cu)) pillar technology instead of through via technology (e.g., through glass via technology). For example, a 3D passive (e.g., solenoid) structure includes a substrate (e.g., a glass substrate or other low loss substrate) and includes a first redistribution layer (RDL), as well as a 3D integrated passive device on the substrate. For example, the 3D integrated passive device (e.g., inductors, capacitors, or a combination thereof) are high-performance components that are built upon a highly insulative substrate that may also have a very low loss. The passive device may be formed on the substrate in accordance with an electroplating process to form the 3D integrated passive device. The 3D integrated passive device may include a transformer, an inductor-capacitor (LC) resonator, or a distributed filter.

Multiple pillars are formed on the substrate. Each of the pillars are taller than the 3D integrated passive device. A molding compound is formed on the substrate. The molding compound may be an epoxy molding compound or capillary underfill material. The molding compound surrounds the 3D integrated passive device and the multiple pillars. Accordingly, the pillars form through mold vias. Multiple external interconnects may be formed on the molding compound and coupled to one or more of the pillars. In one aspect, one or more of the external interconnects may be coupled to the first redistribution layer through the pillars.

In some aspects of the disclosure, the 3D passive structure further includes a second redistribution layer and a passivation layer on the second redistribution layer. The passivation layer defines one or more openings that expose portions of the second redistribution layer through which the external interconnects are coupled to the pillars. In other aspects, the pillars may form part of a three-dimensional solenoid inductor.

Because the high-performance 3D passive structure is formed without a through glass via first implementation or through silicon via implementation, the process flow is less complex. Formation of the 3D passive structure using the copper pillar technology is also low in cost because there are no costs for via formation and filling.

Figure 1:
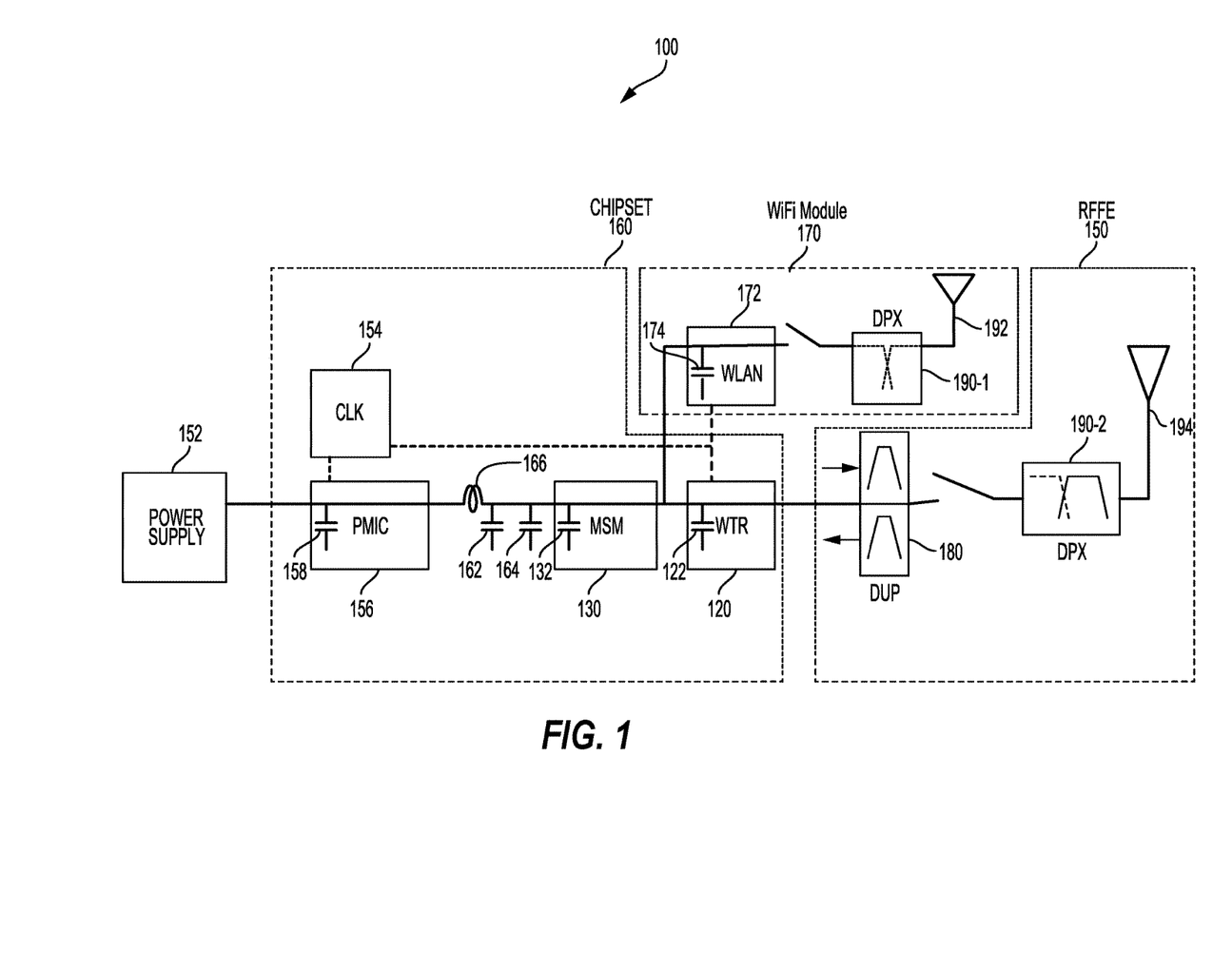
FIG. 1 is a diagram of a radio frequency (RF) communications system.

FIG. 1 is a schematic diagram of a radio frequency (RF) communications system 100 that may include a three-dimensional passive structure, according to an aspect of the present disclosure. Representatively, the RF communications system 100 includes a WiFi module 170 having a first diplexer 190-1 and an RF front-end module 150 including a second diplexer 190-2 for a chipset 160 to provide carrier aggregation according to an aspect of the present disclosure. The WiFi module 170 includes the first diplexer 190-1 communicably coupling an antenna 192 to a wireless local area network module (e.g., WLAN module 172). The RF front-end module 150 includes the second diplexer 190-2 communicably coupling an antenna 194 to a wireless transceiver (WTR) 120 through the duplexer 180. The wireless transceiver 120 and the WLAN module 172 of the WiFi module 170 are coupled to a modem (mobile station modem (MSM), e.g., baseband modem) 130 that is powered by a power supply 152 through a power management integrated circuit (PMIC) 156.

The chipset 160 also includes capacitors 162 and 164, as well as an inductor(s) 166 to provide signal integrity. The PMIC 156, the modem 130, the wireless transceiver 120, and the WLAN module 172 each include capacitors (e.g., 158, 132, 122, and 174) and operate according to a clock 154. The geometry and arrangement of the various inductor and capacitor components in the chipset 160 may reduce the electromagnetic coupling between the components. The RF communications system 100 may also include a power amplifier (PA) integrated with the duplexer 180 (e.g., a power amplifier with integrated duplexer (PAMiD) module). The duplexer 180 may filter the input/output signals according to a variety of different parameters, including frequency, insertion loss, rejection, or other like parameters.

Figure 2:
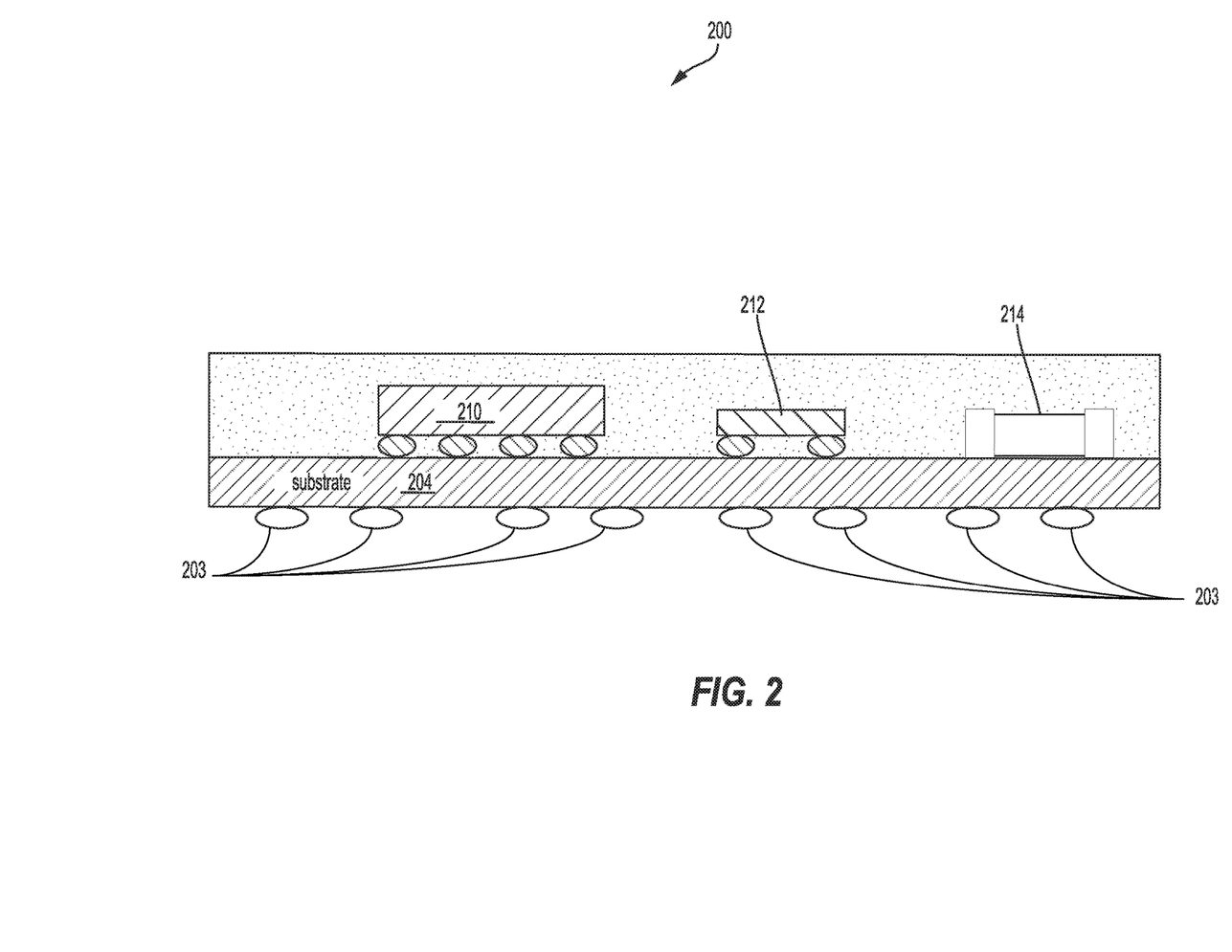
FIG. 2 illustrates a passive device module (e.g., inductor-capacitor (LC) filter).

FIG. 2 illustrates an electronic device module 200. The electronic device module 200 may include an integrated circuit module 210, a filter module 212 (e.g., inductor-capacitor (LC) filter) and a surface mount passive device module 214 (e.g., a capacitor). The filter module 212 may include a capacitor (not shown) that is coupled to an inductor (not shown). Each of the integrated circuit module 210, the filter module 212, and the surface mount passive device module 214 are coupled to a substrate 204. The substrate 204 may be coupled to a printed circuit board (not shown) via interconnects 203.

In some implementations, the electronic device module 200 may be a passive device module. The passive device module 200 can be used in many electronic devices including a multiplexer (e.g., diplexer). It is noted that the passive device module 200 may be used in other electronic devices aside from diplexers.

Figure 3:
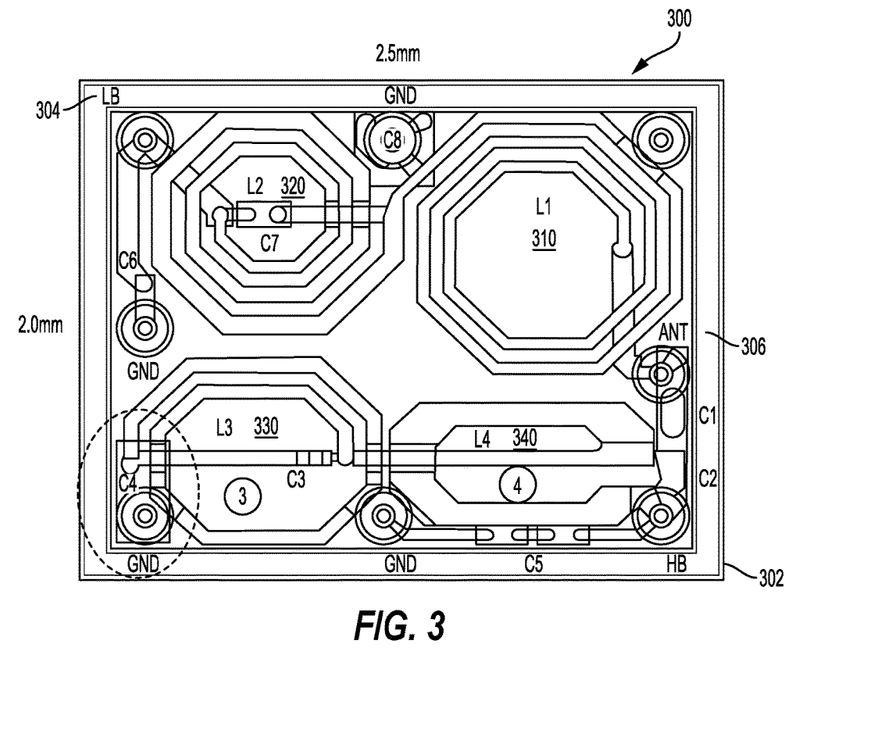
FIG. 3 is a top view of a layout of a diplexer design that include a passive device module, according to an aspect of the present disclosure.

FIG. 3 is a top view of a layout of a diplexer design 300 that includes the passive device module 200 of FIG. 2, according to an aspect of the present disclosure. In this aspect, the components of the diplexer are implemented in (or on) a passive substrate 308. As described herein, the term "passive substrate" may refer to a substrate of a diced wafer or panel, or may refer to the substrate of a wafer/panel that is not diced. In one arrangement, the passive substrate 308 is comprised of glass, air, quartz, sapphire, high-resistivity silicon, or other like passive material. The substrate 308 may be a coreless substrate.

The diplexer design 300 includes a high band (HB) input path 302, a low band (LB) input path 304, and an antenna 306. In this configuration, the first inductor 310 (L1) and the second inductor 320 (L2) are implemented as 2D spiral inductors. In addition, the third inductor 330 (L3) and the fourth inductor 340 (L4) are also implemented with 2D spiral inductors. A thickness of the 2D planar inductors may be within a range of 10 to 30 micrometers. In addition, the footprint occupied by the diplexer design 300 may be in the range of 2.0 millimeters by 2.5 millimeters due to the 2D planar spiral configuration of the inductors. While this configuration may be fabricated using less complicated designs, this configuration consumes additional space.

Figure 4:
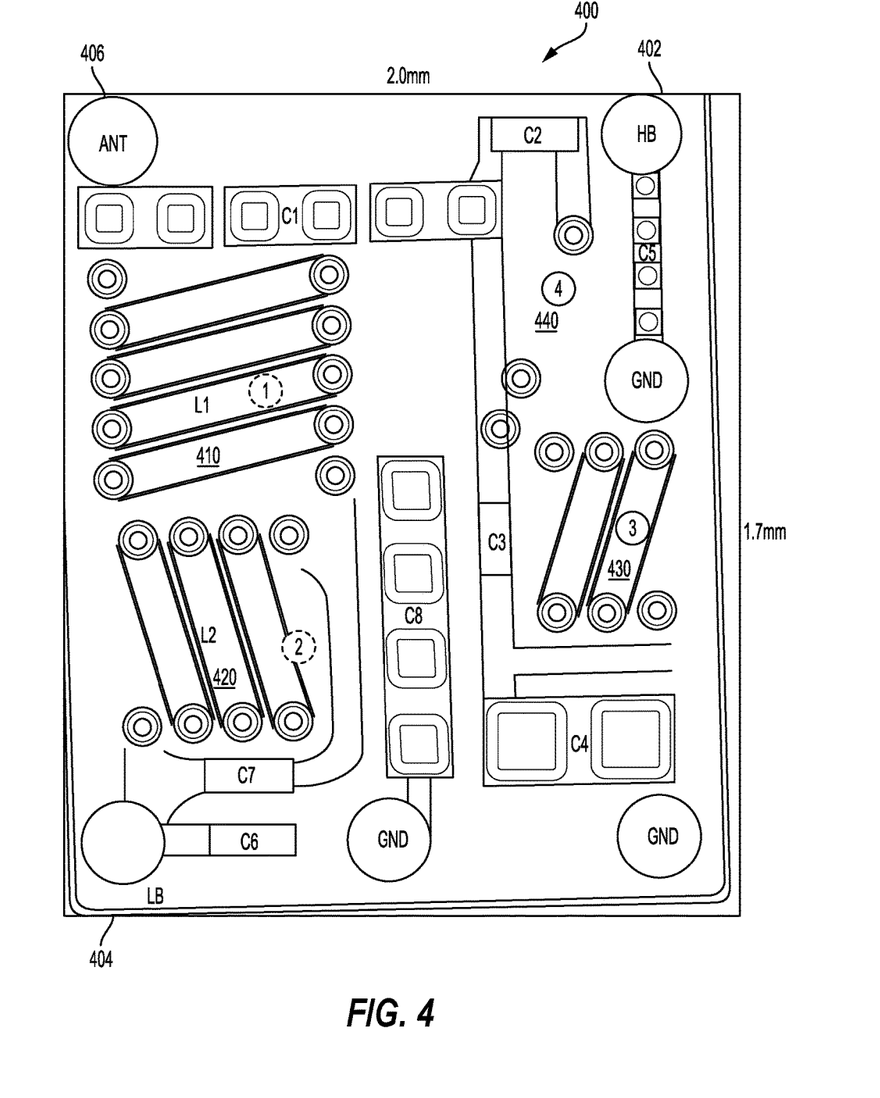
FIG. 4 is a top view of a layout of a diplexer design, according to an aspect of the present disclosure.

FIG. 4 is a top view of a layout of a diplexer design 400, according to an aspect of the present disclosure. The layout of the diplexer design 400 is in accordance with a 3D implementation. In addition, the components are implemented in (or on) a passive substrate (not shown), comprised of glass, air, quartz, sapphire, high-resistivity silicon, or other like passive material.

As shown in FIG. 4, the diplexer design 400 includes a high band (HB) input path 402, a low band (LB) input path 404, and an antenna 406. The first inductor 410 (L1) and the second inductor 420 (L2), however, are 3D spiral inductors. In addition, the third inductor 430 and the fourth inductor 440 are 3D spiral inductors. A reduced footprint is occupied by the diplexer design 400, which is in the range of 2 millimeters by 1.7 millimeters, relative to the diplexer design 300 of FIG. 3.

Figure 5:
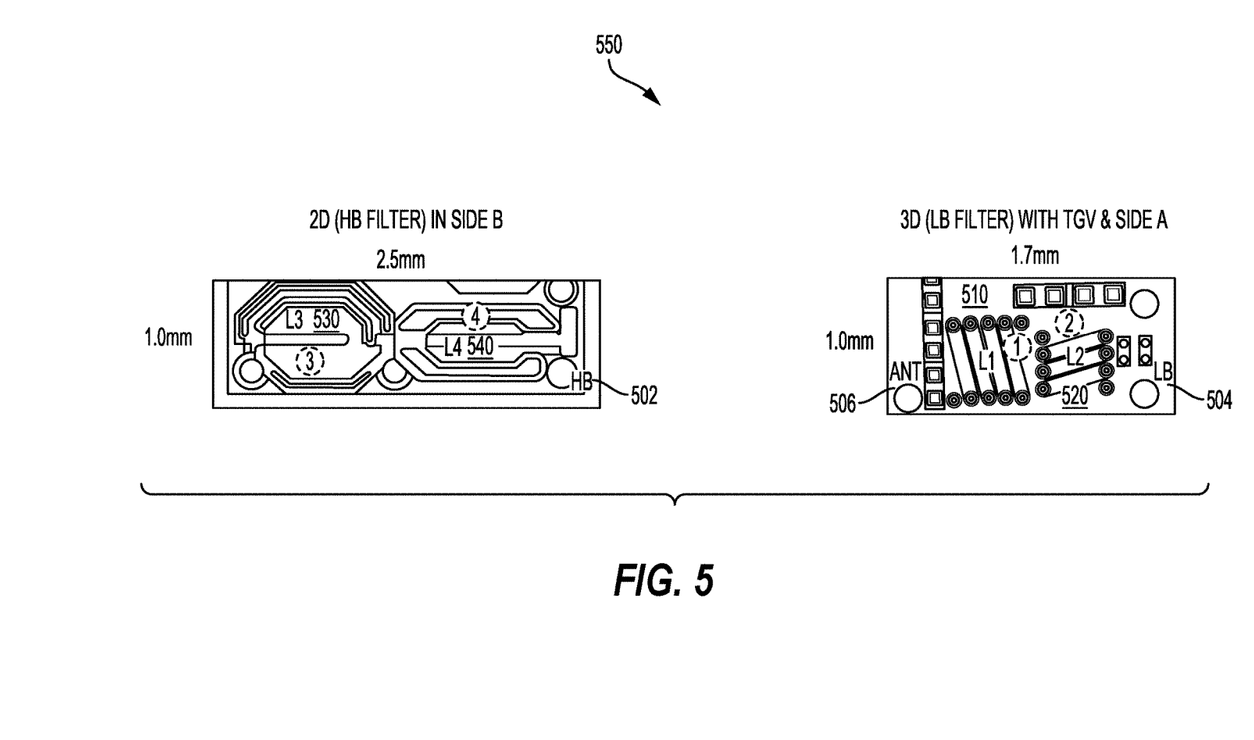
FIG. 5 illustrates a top view of components of a multiplexer structure including a two-dimensional (2D) filter integrated with a three-dimensional (3D) filter for high quality (Q)-factor RF applications, according to aspects of the present disclosure.

FIG. 5 illustrates a top view 550 of components of a multiplexer structure including a 2D filter integrated with a 3D filter for high Q-factor RF applications, according to aspects of the present disclosure. Side B of the multiplexer structure includes a high band filter 502 including a third inductor 530 (L3) and a fourth inductor 540 (L4) implemented as 2D spiral inductors within a 1.0 millimeter by 2.5 millimeter footprint. In addition, side A of the multiplexer structure includes a low band filter 504 including a first inductor 510 (L1) and a second inductor 520 (L2)) implemented as 3D inductors within a 1.0 millimeter by 1.7 millimeter footprint. The multiplexer structure further includes a through glass via(s) (TGV) coupling the high band filter 502 and the low band filter 504.

Figure 6:
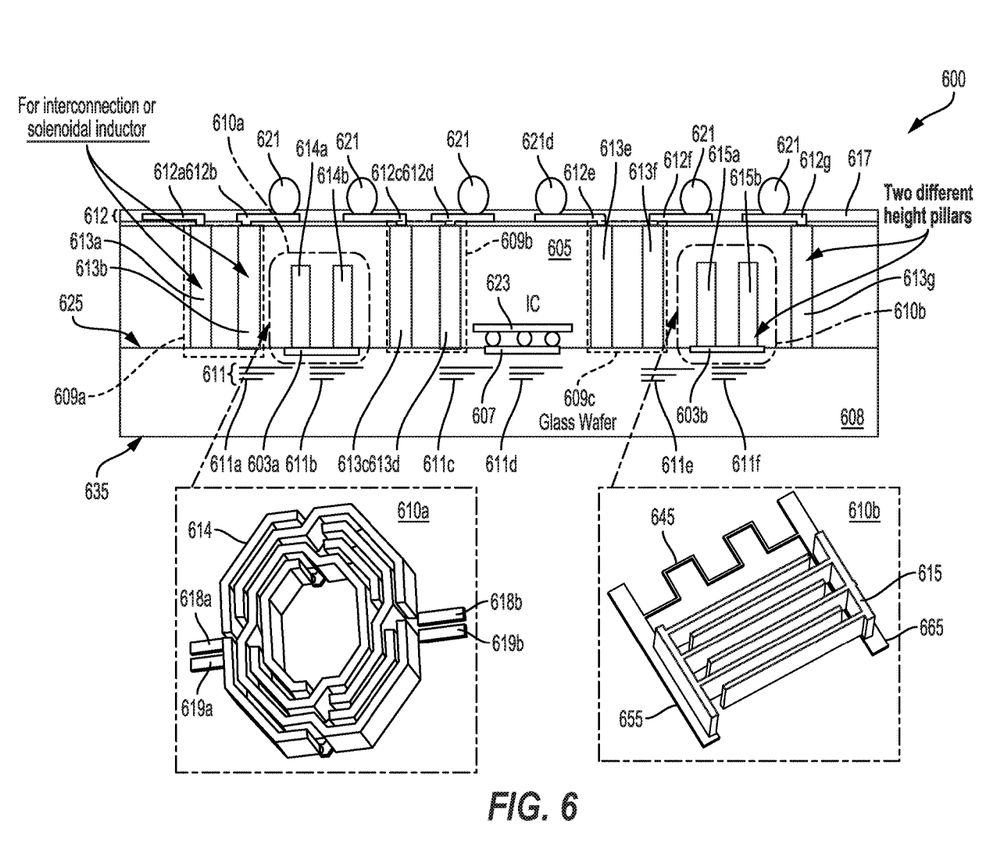
FIG. 6 illustrates a three-dimensional passive structure using conductive pillar technology, according to aspects of the present disclosure.

FIG. 6 illustrates a three-dimensional (3D) passive structure 600 using conductive pillar technology, according to aspects of the present disclosure. The 3D passive structure 600 may be implemented as a system on package including passive devices and/or other integrated circuits. The 3D passive structure 600 may include a substrate (e.g., a glass substrate or other low loss substrate) 608 and includes a first redistribution layer (RDL) 611, a second RDL 612 (conductive layer or metallization), as well as one or more 3D integrated passive devices on the substrate 608. For example, a substrate with a loss tangent below 0.01 is deemed a low-loss substrate. A loss tangent of glass is 0.004 which is below 0.01. Thus, the glass substrate is a low-loss substrate. The first RDL 611 is within the substrate 608 and includes RDL conductive interconnects or metallization 611a, 611b, 611c, 611d, 611e, and 611f configured to couple one or more of the pillars to each other and/or to one or more of the 3D integrated passive devices. In some aspects, conductive traces (e.g., conductive traces 603a, 603b, and 607, respectively, couple conductive pillars of the first 3D integrated passive device 610a, the second 3D integrated passive device 610b, and interconnects of the integrated circuit 623. The 3D passive structure 600 further includes an integrated circuit 623 on the substrate 608. The substrate 608 includes a first surface 625 and a second surface 635 opposite the first surface 625.

The 3D passive structure 600 includes one or more 3D integrated passive devices on the substrate 608. For example, the one or more 3D integrated passive devices include a first 3D integrated passive device 610a and a second 3D integrated passive device 610b formed on the first surface 625 of the substrate 608. In this aspect, the second surface 635 is a free surface. The second RDL 612 may include a first RDL conductive interconnect 612a, a second RDL conductive interconnect 612b, a third RDL conductive interconnect 612c, a fourth RDL conductive interconnect 612d, a fifth RDL conductive interconnect 612e, a sixth RDL conductive interconnect 612f, and a seventh RDL conductive interconnect 612g.

Multiple pillars are formed on the substrate 608. For example, the pillars may include a first set of pillars 609a, a second set of pillars 609b, and a third set of pillars 609c. The first set of pillars 609a may include a first conductive pillar 613a and a second conductive pillar 613b. The second set of pillars 609b includes a third pillar 613c and a fourth pillar 613d. The third set of pillars 609c includes a fifth pillar 613e and a sixth pillar 613f The pillars also include a seventh conductive pillar 613g. Each of the pillars are taller than the 3D integrated passive devices. For example, each of the pillars is taller than the first 3D integrated passive device 610a and the second 3D integrated passive device 610b. In one example, the each of the pillars is between 150 and 200 microns. The 3D integrated passive devices are 150-160 microns. The substrate 608 does not include through substrate vias for connecting the 3D integrated passive devices to external devices. Rather, the 3D integrated passive devices are connected to external devices via the pillars on the first surface 625 of the substrate.

The 3D passive structure 600 further includes a molding compound 605 on the substrate 608. The molding compound 605 may be an epoxy molding compound or capillary underfill material. The molding compound 605 substantially surrounds the first 3D integrated passive device 610*a* and the second 3D integrated passive device 610*b*, the pillars, and the integrated circuit 623. Accordingly, the pillars form through mold vias. Multiple external interconnects 621 (bonding interconnects) may be formed on the molding compound 605 and coupled to one or more of the pillars. The external interconnects 621 may include ball grid arrays (BGAs), land grid arrays (LGAs), etc. In one aspect, one or more of the external interconnects 621 may be coupled to the second redistribution layer 612 through the one or more pillars. The external interconnects 621 may be coupled to the second RDL 612 through openings defined by a passivation layer 617. The molding compound 605 is between the passivation layer 617 and the substrate 608.

The 3D integrated passive devices may include a first 3D integrated passive device 610*a* and a second 3D integrated passive device 610*b*. The first 3D integrated passive device 610*a* and the second 3D integrated passive device 610*b* are formed using the conductive pillar technology (e.g., copper pillar technology) instead of through glass via technology. For example, the first 3D integrated passive device 610*a* is a transformer formed from a spiral configuration. In one aspect, the transformer is realized as two spiral coupled inductors that are formed (e.g., electroplated) on the substrate 608 at a first height that is shorter than a second height of the pillars. The first 3D integrated passive device 610*a* includes conductive windings 614 (e.g., conductive pillars 614*a* and 614*b* are configured into the conductive windings). The conductive windings 614 may include primary windings and secondary windings. A first set of the conductive windings (e.g., primary windings) includes a first terminal 618*a* and a second terminal 619*a*. A second set of the conductive windings (e.g., secondary windings) includes a third terminal 618*b* and a fourth terminal 619*b*. The windings may be inductors implemented in three-dimensions.

In one aspect, the windings of the first 3D integrated passive device 610*a* may be coupled to the pillars and/or the integrated circuit 623 via the first RDL 611. For example, the primary windings of the first 3D integrated passive device 610*a* (e.g., a transformer) may be coupled to the first set of pillars 609*a* through the RDL conductive interconnect 611*a*. The secondary windings of the first 3D integrated passive device 610*a* (the transformer) may be coupled to the second set of pillars 609*b* through the RDL conductive interconnect 611*b*. The pillars are subsequently coupled to external devices such as mixers and amplifiers through the second RDL 612 and the external interconnects 621. For example, the first 3D integrated passive device 610*a* is coupled to one or more pillars of the first set of pillars 609*a* and/or the second set of pillars 609*b* via the first terminal 618*a* and the second terminal 619*a*.

In one aspect of the disclosure, the second 3D integrated passive device 610*b* is an inductor-capacitor (LC) resonator. In one aspect, the LC resonator 610*b* is formed from an interdigital capacitor (e.g., a metal-oxide-metal (MOM) capacitor) 615 (e.g., 615*a* and 615*b*), which is a three-dimensional capacitor and a wire inductor 645. The LC resonator 610*b* includes a first resonator terminal 655 and a second resonator terminal 665. Similar to the first 3D integrated passive device 610*a*, the LC resonator 610*b* is coupled to the pillars (e.g., one or more pillars of the third set of pillars 609*c* and/or the seventh conductive pillar 613*g*) via the first resonator terminal 655 and/or the second resonator terminal 665.

Figure 7:
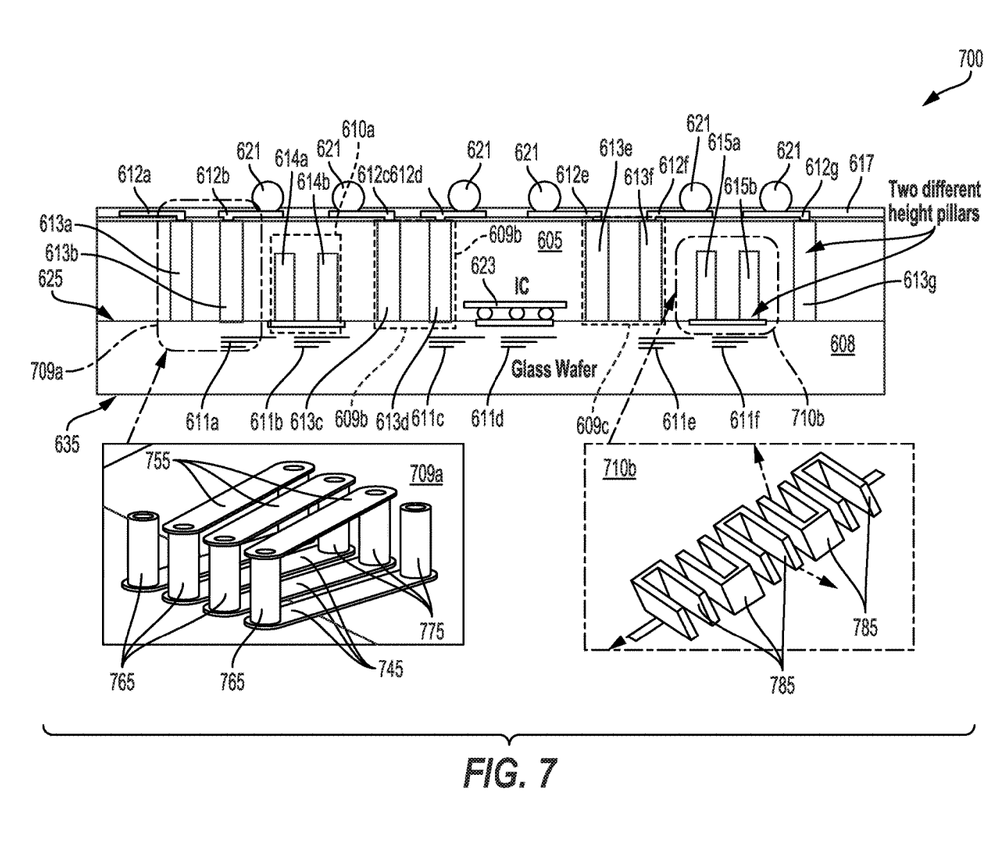
FIG. 7 illustrates a three-dimensional passive structure using conductive pillar technology, according to aspects of the present disclosure.

FIG. 7 illustrates a three-dimensional passive structure 700 using conductive pillar technology, according to aspects of the present disclosure. For illustrative purposes, some of the labelling and numbering of the devices and features of FIG. 7 are similar to those of FIG. 6. However, one or more of the pillars of FIG. 7 are implemented as a three-dimensional solenoidal inductor and one or more of the 3D integrated passive devices of FIG. 7 are implemented as a distributed filter using the copper pillar technology. For example, a first set of pillars 609*a* of FIG. 6 is configured as a 3D solenoidal inductor 709*a* formed with the copper pillar technology, as shown FIG. 7. Further, the second 3D integrated passive device 610*b* of FIG. 6 is configured as a 3D distributed filter 710*b* formed with the copper pillar technology, as shown FIG. 7.

The 3D solenoidal inductor 709*a* is formed on the substrate 608 and may include multiple conductive traces in different layers coupled together with pillars. For example, the 3D solenoidal inductor 709*a* may include a first set of conductive traces 745 and a second set of conductive traces 755 coupled together by a first set of pillars 765 and a second set of pillars 775. The 3D distributed filter 710*b* is formed on the substrate 608 and may include multiple resonators implemented in a three-dimensional format. For example, the 3D distributed filter 710*b* includes resonators at the first height that is shorter than the second height of the multiple pillars or the 3D solenoidal inductor 709*a*.

FIGS. 8A-8F illustrate multiple stages of a process for fabricating a three-dimensional high quality passive structure (e.g., the three-dimensional passive structure 600 of FIG. 6 or the three-dimensional passive structure 700 of FIG. 7), according to aspects of the present disclosure. For illustrative purposes, some of the labelling and numbering of the devices and features of FIGS. 8A-8F are similar to those of FIGS. 6 and 7.

Figure 8A:
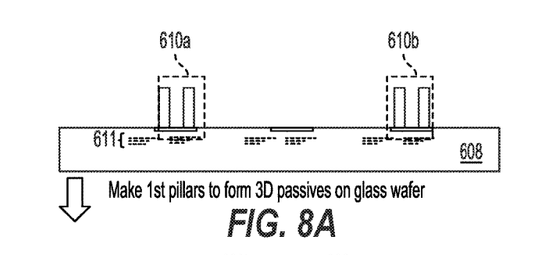
FIGS. 8A-8F illustrate multiple stages of a process for fabricating a three-dimensional high quality passive structure, according to aspects of the present disclosure.

FIG. 8A illustrates a first stage for forming a set of pillars of the first height to form the three-dimensional high quality passive structure on a substrate 608 or wafer. The substrate 608 or wafer may be glass. The 3D high quality passive structure includes one or more 3D integrated passive devices (e.g., formed from the set of pillars) on the substrate 608. For example, the one or more 3D integrated passive devices include the first 3D integrated passive device 610*a* and the second 3D integrated passive device 610*b* formed (e.g., electroplated) on the substrate 608.

Figure 8B:
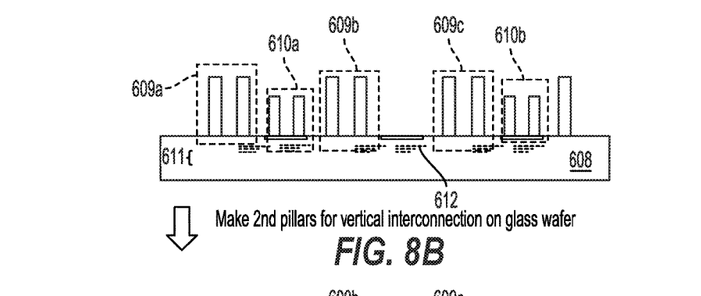

FIG. 8B illustrates a second stage for forming another set of pillars of the second height to form the three-dimensional high quality passive structure on the substrate 608 (or wafer). The other set of pillars may be substantially orthogonal to the substrate 608. For example, the other set of pillars form a vertical interconnection on the substrate 608 (based on the orientation of the substrate). The substrate or wafer may be glass. The other set of pillars may include the first set of pillars 609*a*, the second set of pillars 609*b*, and the third set of pillars 609*c* formed (e.g., electroplated) on the substrate 608. The 3D high quality passive structure includes one or more 3D integrated passive devices (e.g., formed from the other set of pillars) on the substrate 608. For example, the one or more 3D integrated passive devices include the 3D solenoidal inductor 709*a* (as shown in FIG. 7).

Figure 8C:
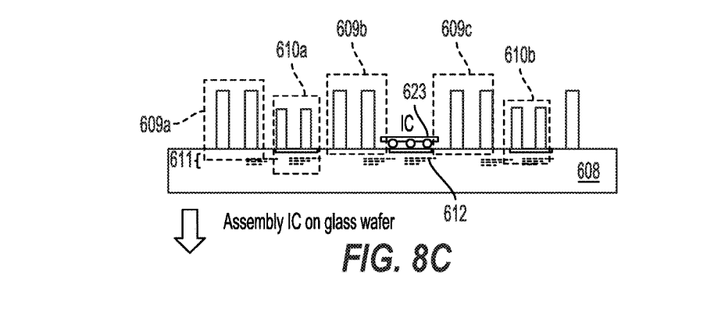

FIG. 8C illustrates a third stage for forming the integrated circuit 623 on the substrate 608. For example, the first 3D integrated passive device 610*a*, the second 3D integrated passive device 610b, the first set of pillars 609a, the second set of pillars 609b, and/or the third set of pillars 609c may be coupled to the integrated circuit 623 via conductive traces or metallization. The conductive traces may be included the first RDL 611.

Figure 8D:
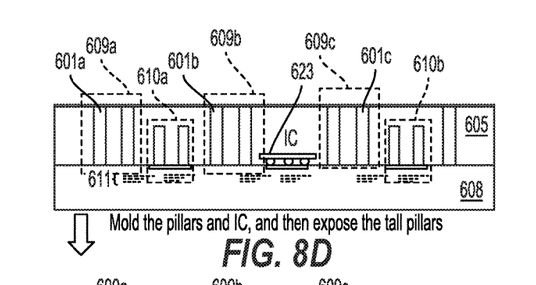

FIG. 8D illustrates a fourth stage for forming the molding compound 605 on the substrate 608. The molding compound 605 may be an epoxy molding compound or capillary underfill material. The molding compound 605 substantially surrounds the first 3D integrated passive device 610a, the second 3D integrated passive device 610b, the first set of pillars 609a, the second set of pillars 609b, the third set of pillars 609c, as well as the integrated circuit 623. However, a portion of each of the first set of pillars 609a, the second set of pillars 609b, and the third set of pillars 609c are exposed (e.g., portions 601a, 601b, and 601c) with back-grinding, for example, to connect to an external device.

Figure 8E:
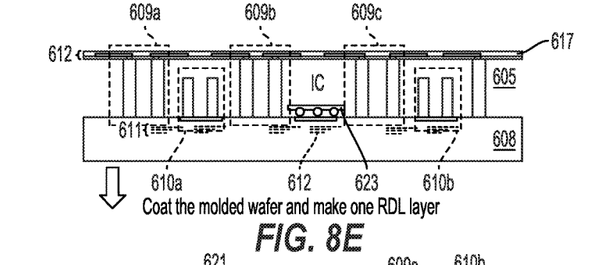

FIG. 8E illustrates a fifth stage for forming a coating on exposed portions of the molding compound 605 and on the first set of pillars 609a, the second set of pillars 609b, and the third set of pillars 609c. The coating may be the passivation layer 617 defining openings on the first set of pillars 609a, the second set of pillars 609b, and the third set of pillars 609c for connecting the first set of pillars 609a, the second set of pillars 609b, and the third set of pillars 609c to external interconnects and/or devices. For example, a second redistribution layer 612 may be formed within the passivation layer 617.

Figure 8F:
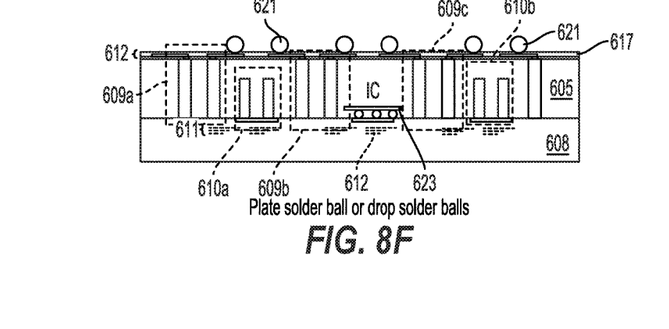

FIG. 8F illustrates a sixth stage for forming external interconnects 621 on exposed portions of the second redistribution layer 612. The passivation layer 617 may define openings to expose portions of the second redistribution layer 612 through which the external interconnects 621 are coupled to the pillars. In the case of fabricating a transformer, the resulting transformer has a higher Q-factor than an on-chip transformer.

The present disclosure has applicability for a wide range of products. For example, concepts described in the disclosure can be employed in RF filters (LC type and distributed), LC tanks (such as for oscillators), inductors for power delivery networks, inductors for power management ICs (PMICs), as well as other products.

Figure 9:
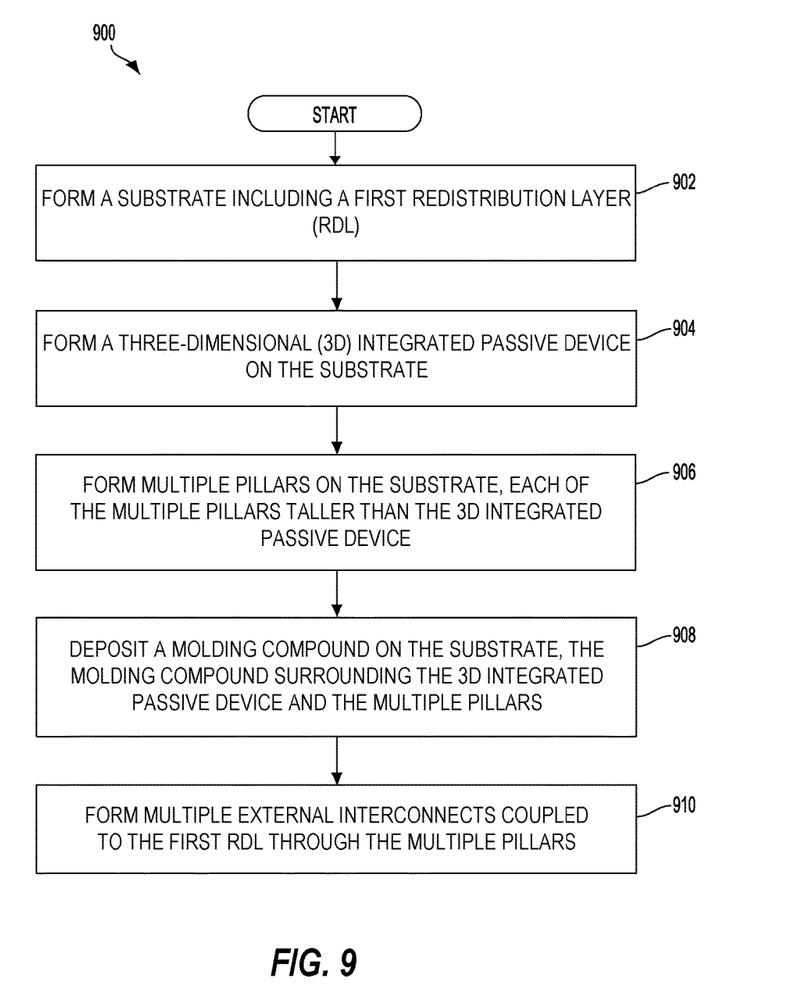
FIG. 9 is a flow diagram illustrating a method of fabricating a three-dimensional high quality passive structure, according to aspects of the present disclosure.

FIG. 9 is a flow diagram illustrating a method 900 of fabricating an electronic device (e.g., a three-dimensional passive structure), according to aspects of the present disclosure. At block 902, a substrate including a first redistribution layer (RDL) is formed. At block 904, a three-dimensional (3D) integrated passive device is formed on the substrate. At block 906, multiple pillars are formed on the substrate. Each of the pillars is taller than the 3D integrated passive device. At block 908, a molding compound is deposited on the substrate. The molding compound surrounds the 3D integrated passive device and the pillars. At block 910, external interconnects coupled to the first RDL through the pillars are formed.

According to one aspect of the present disclosure, a three-dimensional passive structure is described. The three-dimensional passive structure includes means for coupling the first RDL to multiple external interconnects. The coupling means may, for example, be the first conductive pillar 613a, the second conductive pillar 613b, the third pillar 613c, the fourth pillar 613d, the fifth pillar 613e, the sixth pillar 613f, and/or the seventh conductive pillar 613g. In another aspect, the aforementioned means may be any module or any apparatus or material configured to perform the functions recited by the aforementioned means.

Figure 10:
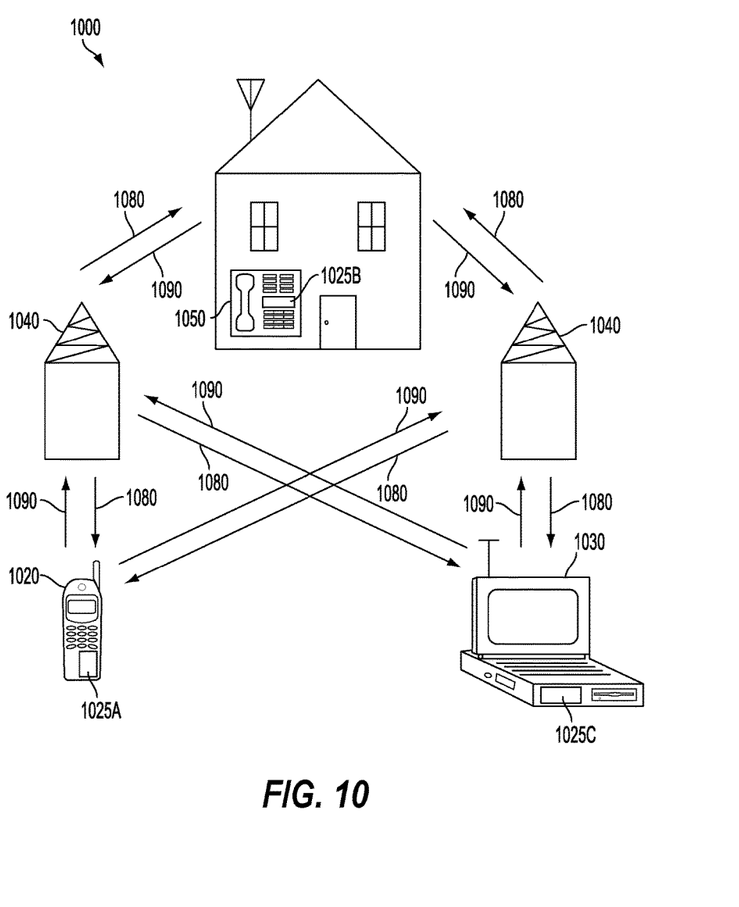
FIG. 10 is a block diagram showing an exemplary wireless communications system in which a configuration of the present disclosure may be advantageously employed.

FIG. 10 is a block diagram showing an exemplary wireless communications system 1000 in which an aspect of the present disclosure may be advantageously employed. For purposes of illustration, FIG. 10 shows three of the remote units 1020, 1030, and 1050 and two of the base stations 1040. It will be recognized that wireless communications systems may have many more remote units and base stations. Remote units 1020, 1030, and 1050 each include IC devices 1025A, 1025C, and 1025B that include the disclosed three-dimensional passive structure. It will be recognized that other devices may also include the disclosed three-dimensional passive structure, such as the base stations, switching devices, and network equipment including a RF front-end module. FIG. 10 shows forward link signals 1080 from one of the base stations 1040 to the remote units 1020, 1030, and 1050 and reverse link signals 1090 from the remote units 1020, 1030, and 1050 to base stations 1040.

In FIG. 10, one of the remote units 1020 is shown as a mobile telephone, one of the remote units 1030 is shown as a portable computer, and remote unit 1050 is shown as a fixed location remote unit in a wireless local loop system. For example, the remote units 1020, 1030, and 1050 may be a mobile phone, a hand-held personal communications systems (PCS) unit, a portable data unit such as a personal digital assistant (PDA), a GPS enabled device, a navigation device, a set top box, a music player, a video player, an entertainment unit, a fixed location data unit such as a meter reading equipment, or a communications device, including an RF front-end module, that stores or retrieves data or computer instructions, or combinations thereof. Although FIG. 10 illustrates remote units according to the aspects of the present disclosure, the present disclosure is not limited to these exemplary illustrated units. Aspects of the present disclosure may be suitably employed in many devices, which include the disclosed three-dimensional passive structure.

Figure 11:
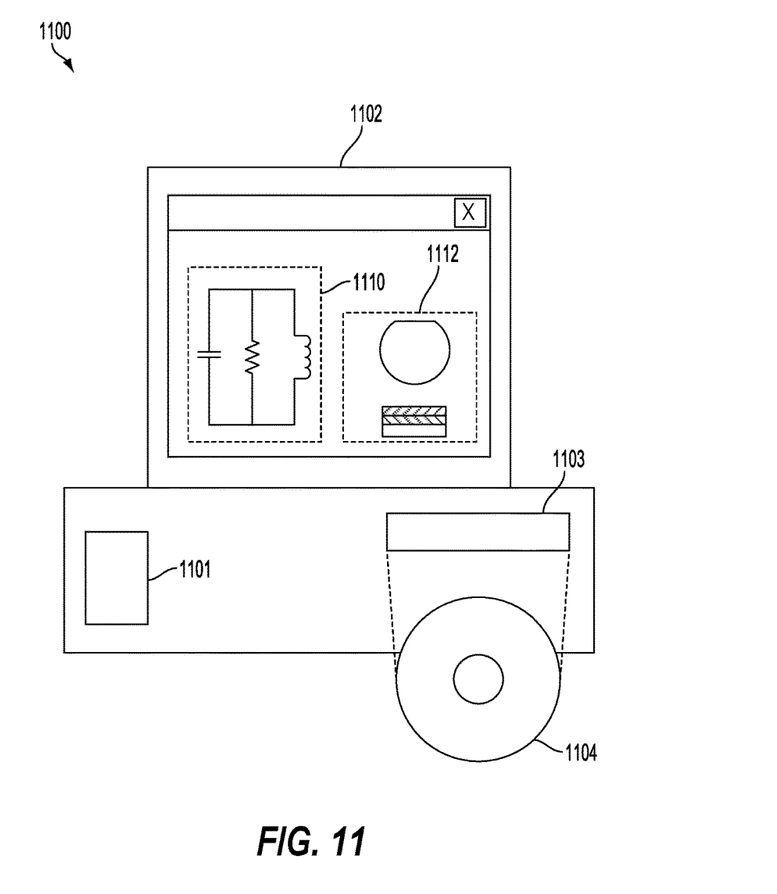
FIG. 11 is a block diagram illustrating a design workstation used for circuit, layout, and logic design of a three-dimensional passive structure, according to aspects of the present disclosure.

FIG. 11 is a block diagram illustrating a design workstation used for circuit, layout, and logic design of the three-dimensional passive structure disclosed above. A design workstation 1100 includes a hard disk 1101 containing operating system software, support files, and design software such as Cadence or OrCAD. The design workstation 1100 also includes a display 1102 to facilitate design of a circuit 1110 or the three-dimensional passive structure. A storage medium 1104 is provided for tangibly storing the design of the circuit 1110 or the three-dimensional passive structure. The design of the circuit 1110 or the three-dimensional passive structure may be stored on the storage medium 1104 in a file format such as GDSII or GERBER. The storage medium 1104 may be a CD-ROM, DVD, hard disk, flash memory, or other appropriate device. Furthermore, the design workstation 1100 includes a drive apparatus 1103 for accepting input from or writing output to the storage medium 1104.

Data recorded on the storage medium 1104 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 1104 facilitates the design of the circuit 1110 or the three-dimensional passive structure by decreasing the number of processes for designing semiconductor or passive wafers.

For a firmware and/or software implementation, the methodologies may be implemented with modules (e.g., procedures, functions, and so on) that perform the functions described herein. A machine-readable medium tangibly embodying instructions may be used in implementing the methodologies described herein. For example, software codes may be stored in a memory and executed by a processor unit. Memory may be implemented within the processor unit or external to the processor unit. As used herein, the term "memory" refers to types of long term, short term, volatile, nonvolatile, or other memory and is not to be limited to a particular type of memory or number of memories, or type of media upon which memory is stored.

If implemented in firmware and/or software, the functions may be stored as one or more instructions or code on a non-transitory computer-readable medium. Examples include computer-readable media encoded with a data structure and computer-readable media encoded with a computer program. Computer-readable media includes physical computer storage media. A storage medium may be an available medium that can be accessed by a computer. By way of example, and not limitation, such computer-readable media can include RAM, ROM, EEPROM, CD-ROM or other optical disk storage, magnetic disk storage or other magnetic storage devices, or other medium that can be used to store desired program code in the form of instructions or data structures and that can be accessed by a computer; disk and disc, as used herein, includes compact disc (CD), laser disc, optical disc, digital versatile disc (DVD) and Blu-ray disc where disks usually reproduce data magnetically, while discs reproduce data optically with lasers. Combinations of the above should also be included within the scope of computer-readable media.

In addition to storage on computer-readable medium, instructions and/or data may be provided as signals on transmission media included in a communications apparatus. For example, a communications apparatus may include a transceiver having signals indicative of instructions and data. The instructions and data are configured to cause one or more processors to implement the functions outlined in the claims.

Although the present disclosure and its advantages have been described in detail, it should be understood that various changes, substitutions, and alterations can be made herein without departing from the technology of the present disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above and below may refer to sides of a substrate or electronic device. Moreover, the scope of the present application is not intended to be limited to the particular configurations of the process, machine, manufacture, and composition of matter, means, methods, and steps described in the specification. As one of ordinary skill in the art will readily appreciate from the present disclosure, processes, machines, manufacture, compositions of matter, means, methods, or steps, presently existing or later to be developed that perform substantially the same function or achieve substantially the same result as the corresponding configurations described herein may be utilized according to the present disclosure. Accordingly, the appended claims are intended to include within their scope such processes, machines, manufacture, compositions of matter, means, methods, or steps.

Those of skill would further appreciate that the various illustrative logical blocks, modules, circuits, and algorithm steps described in connection with the present disclosure herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the present disclosure herein may be implemented or performed with a general-purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, multiple microprocessors, one or more microprocessors in conjunction with a DSP core, or any other such configuration.

The steps of a method or algorithm described in connection with the present disclosure may be embodied directly in hardware, in a software module executed by a processor, or in a combination of the two. A software module may reside in RAM, flash memory, ROM, EPROM, EEPROM, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communications media including any medium that facilitates transfer of a computer program from one place to another. A storage media may be any available media that can be accessed by a general purpose or special purpose computer. By way of example, and not limitation, such computer-readable media can include RAM, ROM, EEPROM, CD-ROM or other optical disk storage, magnetic disk storage or other magnetic storage devices, or any other medium that can be used to carry or store specified program code means in the form of instructions or data structures and that can be accessed by a general-purpose or special-purpose computer, or a general-purpose or special-purpose processor. In addition, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), and Blu-ray disc where disks usually reproduce data magnetically, while discs reproduce data optically with lasers. Combinations of the above should also be included within the scope of computer-readable media.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language of the claims, wherein reference to an element in the singular is not intended to mean "one and only one" unless specifically so stated, but rather "one or more." Unless specifically stated otherwise, the term "some" refers to one or more. A phrase referring to "at least one of" a list of items refers to any combination of those items, including single members. As an example, "at least one of: a, b, or c" is intended to cover: a; b; c; a and b; a and c; b and c; and a, b, and c. All structural and functional equivalents to the elements of the various aspects described throughout this present disclosure that are known or later come to be known to those of ordinary skill in the art are expressly incorporated herein by reference and are intended to be encompassed by the claims. Moreover, nothing disclosed herein is intended to be dedicated to the public regardless of whether such present disclosure is explicitly recited in the claims. No claim element is to be construed under the provisions of 35 U.S.C. § 112, sixth paragraph, unless the element is expressly recited using the phrase "means for" or, in the case of a method claim, the element is recited using the phrase "a step for."

What is claimed is:

1. A device, comprising:
   a substrate including a first RDL (first redistribution layer);
   a 3D integrated passive device (three-dimensional integrated passive device) on the substrate;
   a plurality of pillars on the substrate, each of the plurality of pillars taller than the 3D integrated passive device;
   a molding compound on the substrate and surrounding the 3D integrated passive device and the plurality of pillars; and
   a plurality of external interconnects coupled to the first RDL through the plurality of pillars, the 3D integrated passive device coupled to the plurality of external interconnects via the first RDL and the plurality of pillars.

2. The device of claim 1, further comprising a second RDL having a passivation layer, the second RDL between the molding compound and the external interconnects and coupling the plurality of pillars to the external interconnects.

3. The device of claim 1, in which the 3D integrated passive device comprises a transformer, an inductor-capacitor (LC) resonator, or a distributed filter.

4. The device of claim 1, in which the plurality of pillars comprises a three-dimensional (3D) solenoidal inductor.

5. The device of claim 1, in which the substrate comprises a low loss substrate.

6. The device of claim 1, in which the substrate comprises glass.

7. A method of fabricating an electronic device, the method comprising:
   forming a substrate including a first RDL (first redistribution layer);
   forming a three-dimensional (3D) integrated passive device on the substrate;
   forming a plurality of pillars on the substrate, each of the plurality of pillars taller than the 3D integrated passive device;
   depositing a molding compound on the substrate, the molding compound surrounding the 3D integrated passive device and the plurality of pillars; and
   forming a plurality of external interconnects coupled to the first RDL through the plurality of pillars, the 3D integrated passive device coupled to the plurality of external interconnects via the first RDL and the plurality of pillars.

8. The method of claim 7, further comprising forming a second RDL having a passivation layer, the second RDL between the molding compound and the external interconnects and coupling the plurality of pillars to the external interconnects.

9. The method of claim 7, in which forming the 3D integrated passive device comprises forming a transformer, an inductor-capacitor (LC) resonator, or a distributed filter.

10. The method of claim 7, in which forming the plurality of pillars comprises forming a three-dimensional (3D) solenoidal inductor.

11. A radio frequency (RF) front end module comprising:
    a device having a substrate including a first RDL (first redistribution layer), a 3D integrated passive device (three-dimensional integrated passive device) on the substrate, a plurality of pillars on the substrate, each of the plurality of pillars taller than the 3D integrated passive device, a molding compound on the substrate and surrounding the 3D integrated passive device and the plurality of pillars, and a plurality of external interconnects coupled to the first RDL through the plurality of pillars, the 3D integrated passive device coupled to the plurality of external interconnects via the first RDL and the plurality of pillars; and
    an antenna coupled to the device.

12. The radio frequency front end module of claim 11, further comprising a second RDL having a passivation layer, the second RDL between the molding compound and the external interconnects and coupling the plurality of pillars to the external interconnects.

13. The radio frequency front end module of claim 11, in which the 3D integrated passive device comprises a transformer, an inductor-capacitor (LC) resonator, or a distributed filter.

14. The radio frequency front end module of claim 11, in which the plurality of pillars comprises a three-dimensional (3D) solenoidal inductor.

15. The radio frequency front end module of claim 11, in which the substrate comprises a low loss substrate.

16. The radio frequency front end module of claim 11, in which the substrate comprises glass.

* * * * *